Figure 1A:
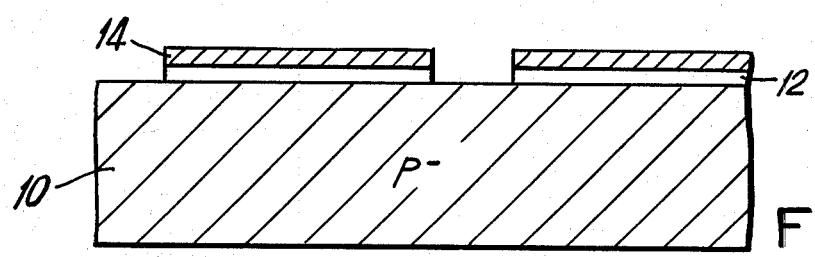

United States Patent [19]

Richman

[11] 4,208,780
[45] Jun. 24, 1980

[54] LAST-STAGE PROGRAMMING OF SEMICONDUCTOR INTEGRATED CIRCUITS INCLUDING SELECTIVE REMOVAL OF PASSIVATION LAYER

[75] Inventor: Paul Richman, St. James, N.Y.

[73] Assignee: RCA Corporation, New York, N.Y.

[21] Appl. No.: 930,739

[22] Filed: Aug. 3, 1978

[51] Int. Cl.² .............................................. B01J 17/00
[52] U.S. Cl. ................................. 29/571; 29/577 R; 29/578; 29/579; 29/589
[58] Field of Search .................. 29/571, 578, 579, 589, 29/577

[56] References Cited

U.S. PATENT DOCUMENTS

| | | | |
|---|---|---|---|
| 3,258,898 | 7/1966 | Garibotti | 29/576 B |
| 3,747,203 | 7/1973 | Shannon | 29/576 B |
| 3,775,191 | 11/1973 | McQuhae | 29/571 |
| 4,080,718 | 3/1978 | Richman | 29/571 |
| 4,086,694 | 5/1978 | U | 29/579 |

*Primary Examiner*—W. C. Tupman
*Attorney, Agent, or Firm*—Eugene M. Whitacre; William H. Meagher; Ronald H. Kurdyla

[57] ABSTRACT

A process for selectively modifying the electrical characteristics of selected MOS devices in an integrated circuit, such as in programming a read-only memory, at or near the final stage of circuit fabrication, includes the formation of a photoresist layer over the passivation layer of a nearly completed structure. Relatively narrow openings are formed in the photoresist at those locations at which it is desired to modify the underlying MOS devices, and wider openings are formed over the locations of bonding pads. Ion implantation is carried out through the narrow openings in the photoresist layer—the photoresist acting as an implantation barrier—to modify the underlying MOS devices. An oblique angle ion milling procedure is carried out in which the walls of the photoresist layer shield the passivation layer exposed by the narrow openings in the photoresist layer so as to remove the exposed portion of the passivation layer only over the bonding pad locations. The photoresist layer is subsequently removed.

13 Claims, 9 Drawing Figures

LAST-STAGE PROGRAMMING OF SEMICONDUCTOR INTEGRATED CIRCUITS INCLUDING SELECTIVE REMOVAL OF PASSIVATION LAYER

The present invention relates generally to MOS devices, and more particularly to a method for selectively modifying the electrical characteristics of MOS devices in an integrated circuit at or near the last stage of circuit fabrication.

In U.S. Pat. No. 4,080,718 by the present applicant and assigned to the same assignee as the present application, there is disclosed a process for selectively modifying MOS devices, such as to program an MOS read-only memory, by implanting ions through selectively removed portions of a passivation layer, such as a layer of silicon nitride, into the underlying substrate at the locations of the gate channel regions of the MOS devices that are to be so modified. This operation causes the formation of implantation regions at those channel regions, which modify the threshold voltage at those channel regions to, for example, alter the logic storage at these MOS devices from a logic "1" to a logic "0".

By this process, unprogrammed or uncoded MOS memories may be nearly completely fabricated and stored until such time as it is desired to code or program the memory. At that time, an additional photolithographic operation is performed to form openings in the passivation layer at selected MOS devices and the ion implantation is performed to modify the MOS devices at the locations of those openings. During the same photolithographic step, the locations of the bonding pads are opened or exposed so that leads can be attached to the completed circuit.

Integrated circuits that have been programmed or coded by this process have been found to be highly reliable, particularly when the completely programmed circuit chip was assembled in a hermetic, moisture-free package of the kind that is typically made of a ceramic material. It has, however, been found that when the completed integrated circuit formed by this process is assembled in a less costly package, which is not moisture-free, the integrated circuit may be subsequently adversely affected by the introduction of moisture into the package. More specifically, in etching away the overlying passivation layer in the areas above selected, modified bit locations, the integrity of the silicon nitride overlay would be affected, since a path for the penetration of moisture directly into the chip would be created. The passivation layer could thus be etched way at specific bit locations not only over the polysilicon layer overlying the channel regions of those bit locations but also over some of the surrounding phosphosilicate glass. Moisture entering through this opening may combine with the phosphosilicate glass to form phosphoric acid, which could attack the aluminum metalization layer of the integrated circuit, and thereby seriously degrade the reliability of the device.

Thus, to assemble or enclose the programmed MOS device in a low-cost, non-hermetic package in accordance with this process would necessitate additional photolithographic operations involving the use of a suitably delineated photoresist as an implantation barrier, removing the remaining photoresist layer prior to depositing the nitride layer, and then opening holes in the nitride layer only at the bonding pad locations so that the desired integrity of the silicon nitride layers could be maintained. Such additional steps in the fabrication of the MOS circuit would add to the cost of the circuit and thereby lose the savings in cost achieved by assembling the device in a low-cost package.

It is, therefore, an object of the invention to provide a process for coding or programming an MOS device, such as a read-only memory, at or near the final stage of device fabrication.

It is another object of the invention to provide a process of the type described in which the MOS device thus fabricated can be assembled in a low-cost, non-hermetic package or assembly without the need for additional photolithographic operations to prevent damage to the device by moisture and other contaminents.

It is a further object of the invention to provide a process for fabricating an MOS device that can be modified at or near the last stage of fabrication, and which can be packaged in a non-hermetic package without the possibility of future damage resulting from moisture or contaminants entering the package.

In accordance with the present invention, a passivation layer is formed over the MOS devices and bonding pads. The electrical characteristics of selected MOS devices are modified by an ion implantation process and the passivation layer is removed from over the bonding pads but remains over the MOS devices, even those which are selectively modified.

In one aspect of the present invention, prior to the ion implantation process and the selective removal of the passivation layer from the bonding pads, a photoresist layer is formed over the passivation layer. Narrow openings are defined in the photoresist layer overlying the locations at which it is desired subsequently to modify the electrical characteristics of the MOS devices. Ions at a high energy are impinged perpendicularly onto the integrated circuit and pass through the narrow openings in the photoresist layer, the portions of the passivation layer exposed by these openings, and the underlying gate structures and into the underlying substrate, to form implantation regions in the channel regions of these MOS devices. The implantation regions are effective to make the desired modifications of the electrical characteristic associated with the MOS devices in which they are thus formed. The remaining photoresist layer acts as an implantation barrier during the ion implantation procedure.

Also formed in the photoresist layer are relatively wide openings which overlie the bonding pads. To remove the passivation layer from the bonding pads, an oblique angle ion milling operation is carried out in which ions at a relatively low energy level strike the surface of the integrated circuit at a predetermined angle. These low-energy ions strike and remove the exposed passivation layer from over the bonding pads, but do not strike and thus do not remove the exposed portions of the passivation layer overlying the ion-implanted, modified MOS devices because, as will be explained in greater detail below, of the angle of the incident ions, the relative widths of the openings in the photoresist layer that expose those portions of the passivation layer, and the height of the photoresist walls at those openings. After the ion implantation and ion milling operations are completed, the photoresist layer is removed.

Figure 1B:
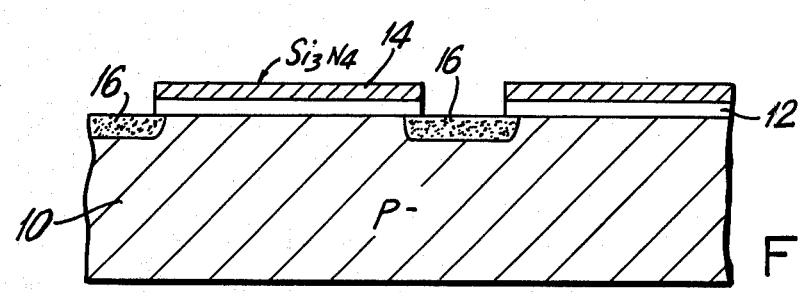
Figure 1C:
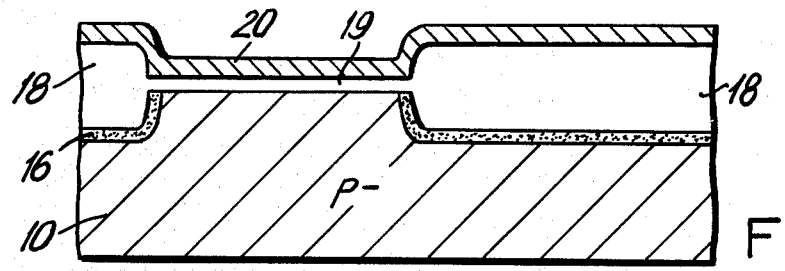
Figure 1D:
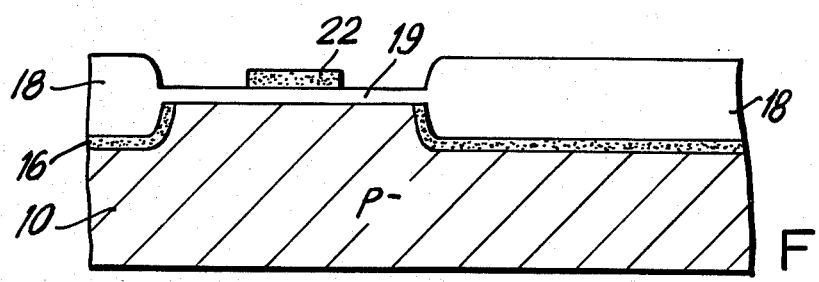
Figure 1E:
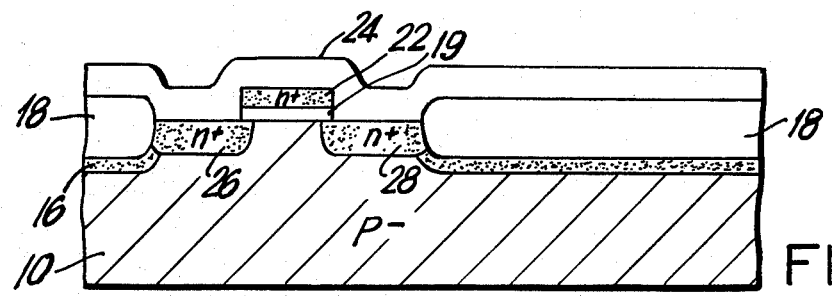
Figure 1F:
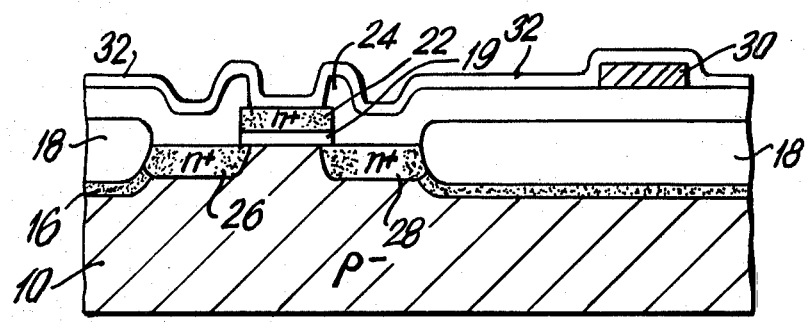
Figure 1G:
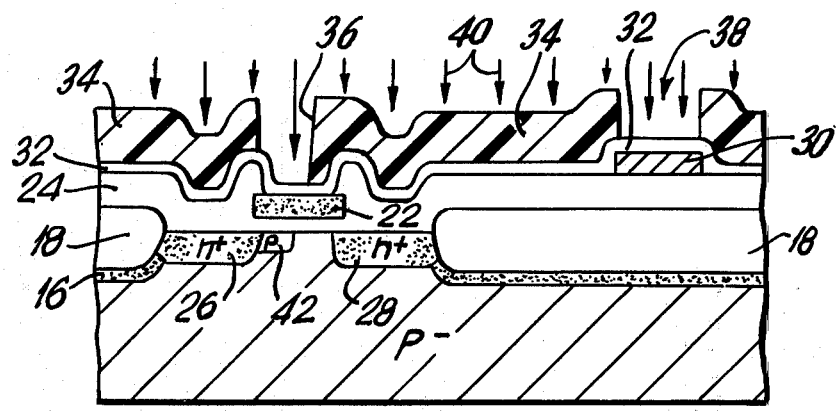
Figure 1H:
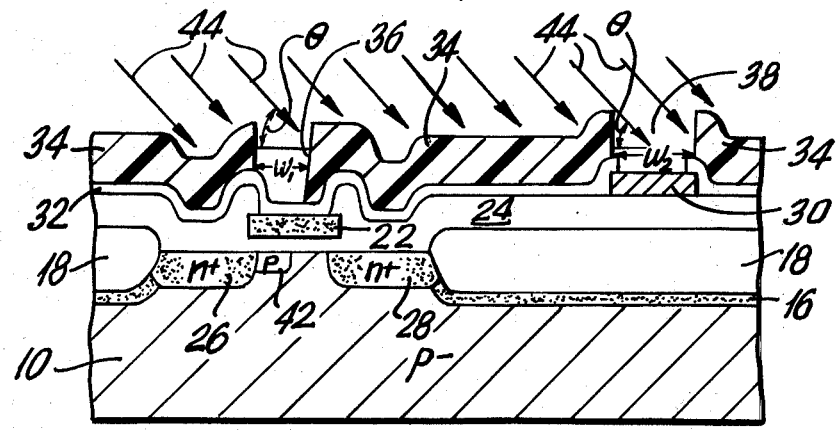
Figure 1I:
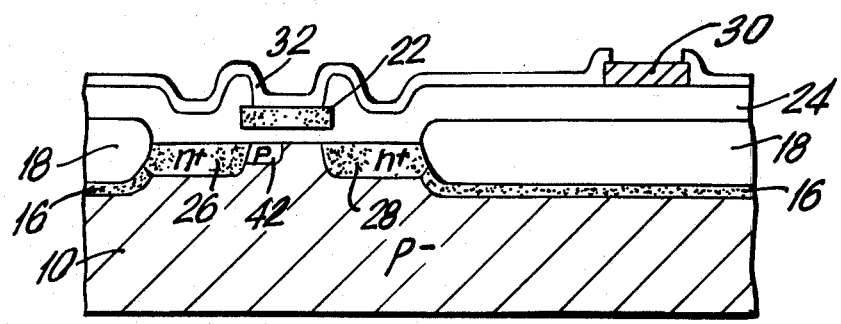

To the accomplishment of the above and to such further objects as may hereinafter appear, the present invention relates to an improved process for modifying the electrical characteristics of an MOS device substantially as defined in the appended claims, and as described in the following specification as considered with the accompanying drawings, in which FIGS. 1(a)–1(i) are partial cross-sectional views illustrating some of the steps employed in a process according to the present invention, the completed device being shown in FIG. 1(i).

In The process of the invention illustrated in FIGS. 1(a)–1(i), the logic storage of a single cell or MOS device of a read-only memory is selectively modified by modifying the threshold voltage of the MOS device. The process begins with a substrate 10 of p-type silicon, which may be between 2 and 50 ohm-cm (100) orientation. A dielectric sandwich consisting of a thin (approximately 200 to 1200 Å) layer of silicon dioxide 12 and an overlying layer of silicon nitride 14 is formed over the substrate. Layers 12 and 14 are selectively removed in a first photolithographic operation to leave, as shown in FIG. 1(a), the oxide-nitride sandwich remaining over regions of the substrate that will subsequently become the drain, source, channel, or diffused interconnect regions of MOS devices.

Next, the patterned photoresist layer, which is employed to perform the first photolithographic operation, may be also employed, prior to the removal of the unprotected portions of layers 12 and 14, as a barrier to the implantation into the surface of the silicon substrate of boron atoms, thereby to selectively form p-regions 16 in the surface of the substrate, as shown in FIG. 1(b). After the removal of the unprotected portions of layers 12 and 14, the remaining photoresist is removed.

The wafer is then subjected to localized thermal oxidation in wet oxygen at a temperature of about 975° C. to convert the unprotected surface of the substrate to a thick (e.g. 10,000 Å) layer of silicon dioxide 18, which extends below the original surface of the substrate, as shown in FIG. 1(c), and diffuses the p layer 16 downward into the substrate. The thermal oxidation converts a portion of the silicon nitride film 14 to silicon dioxide, and the converted oxide, the remaining silicon nitride, and the underlying thin layer of silicon dioxide are removed, and a thin layer of silicon dioxide 19 is subsequently regrown on all exposed portions of the silicon surface, as shown in FIG. 1(c).

Thereafter, a layer of polycrystalline silicon 20 is pyrolitically deposited over the entire surface of the wafer. Then, as shown in FIG. 1(d), a second photolithographic operation is performed to selectively remove portions of the polycrystalline layer 20, such as by the use of a mixture of hydrofluoric, acetic, and nitric acids, to leave a polycrystalline silicon area 22, which will subsequently serve as the gate electrode for the MOS device.

A layer 24 of silicon dioxide doped with an n-type impurity such as phosphorous is deposited over the entire surface of the wafer and is heated at a temperature of about 1050° C. for 10 to 15 minutes in a nitrogen dry ambient. This phosphorous-doped oxide layer serves as a diffusion source to form the n+ source and drain regions 26 and 28 (FIG. 1(e)) and also dopes the polycrystalline gate region 22 with n-type impurities. Alternatively, an n+ diffusion may also be performed prior to the deposition of the phosphorous-doped silicon dioxide.

Thereafter, as shown in FIG. 1(f), a third photolithographic operation is carried out to selectively form contact holes (not shown) in the phosphorous-doped silicon dioxide layer 24, and at the same time to form openings in layer 24 overlying the location of the polycrystalline silicon gate 22 of those MOS devices at which the electrical characteristics, e.g. threshold voltages, are to be subsequently modified. Metal interconnections and bonding pad regions, such as 30, are formed where desired through a fourth photolithographic operation on the upper surface of the layer 24. Thereafter, the entire surface of the wafer is covered with a passivation layer 32, which, as herein shown, may be a layer of silicon nitride having a typical thickness in the order of 1,000 to 5,000 Å.

A photoresist layer 34 (FIG. 1(g)) is then formed over the surface of the wafer and over the nitride passivation layer 32, and a fifth photolithographic operation is performed to form narrow (typically 2µ to 20µ) openings 36 at the locations overlying the channel regions of the MOS devices at which modification of the electrical characteristics is to be subsequently made, and at least in partial alignment with the opening previously made in layer 24 over those channel regions. At the same time, a substantially wider (e.g. 5.0 mil) opening 38 is formed in the photoresist layer 34 overlying the bonding pads, such as 30, which, at this stage in the process, is covered by the passivation layer 32. The significance of the different widths of openings 36 and 38 in the photoresist layer 34 will become apparent in a following portion of the specification.

As also shown in FIG. 1(g), high-energy (e.g. 150 Kev or higher) ions 40 of a p-type impurity, e.g. boron, are caused to be incident on the surface of the wafer in a substantially perpendicular direction. The boron ions pass through the openings in the photoresist layer and are of sufficient energy also to pass through the exposed passivation layer 32 and the underlying doped polysilicon gate layer 22 and the underlying thin oxide layer into the upper surface of the substrate, thereby to form a p-type implanted region 42. In the remainder of the wafer, the remaining photoresist 34 and the bonding pad 30 act as implantation barriers. The formation of the implantation region 42, as described in the aforesaid patent, is effective to modify the threshold voltage at the channel region between the source and drain regions 26 and 28, so as, for example, to modify the MOS device, which these regions along with polysilicon gate 22 constitute, from a logic "0" to a logic "1" in a read-only memory.

It will, however, be noted at this stage of the process (FIG. 1(g)) that a portion of the passivation layer 32 remains over the bonding pad 30 and prevents the making of electrical connection to that contact as is necessary to complete the circuit, as well as over the polysilicon gate of the modified MOS device, as is desired, to maintain the integrity of the MOS device even if the wafer is subsequently packaged in a relatively low-cost, non-hermetic package.

According to one aspect of the present invention, the passivation layer of silicon nitride overlying the bonding pad 30 is removed by a process that does not affect or remove the exposed passivation layer overlying the modifying MOS device. This is achieved in the process of the invention, as illustrated by the embodiment herein disclosed, by the use of an ion milling etching technique, and more particularly an oblique-angle ion milling technique.

The ion milling technique is described in "Ion Milling for Semiconductor Production Processes" by L. D. Bollinger, in the November, 1977, issue of *Solid State Technology*. The use of an "oblique-angle" ion milling procedure to remove selected regions within a semiconductor integrated circuit is described in a paper presented at the 1977 International Electron Device Meeting, entitled "A New Fabrication Method of Short Channel MOSFET—Multiple Walls Self-Aligned MOSFET," by Shibata, Iwasaki, Oku, and Tarui.

Broadly described, and as illustrated in FIG. 1(h), an ion milling procedure involves the bombardment of the surface of a semiconductor wafer with ions 44, such as of argon, at a relatively low energy in the range of 500 eV to 1,000 eV. When these ions strike the wafer surface they sputter off the surface atoms and thus remove the surface material at a controlled rate depending on the energy level of the ions and the material of the surface material being removed. As disclosed in the Shibata publication, the use of spaced resist walls of a predetermined height, and the radiation of the ion beam at a specified incident angle permits the removal of selected portions of the surface, while other portions of the surface are not struck and are thus unaffected by the ions. It should be noted that the height of the masking material, in this case the photoresist, will also be decreased by the ion milling process.

In the process of the present invention, as described herein, the low-energy milling ions are caused to be incident on the wafer at an angle which is a function of the height of the photoresist layer 34 and the width of the openings 36 and 38 in that layer, such that these ions remove only the passivation layer from over the bonding pads. Thus, if the width of opening 36 in the photoresist layer 34 is $w_1$ and the height of the photoresist walls after the ion milling operation is performed at opening 36 is h, the milling ions will be shielded by the photoresist wall from striking the passivation layer at the bottom of opening 36 if the ions are incident to the wafer at an angle less than a critical angle $\theta_{c1}$. For opening 36, the following relationship for angle $\theta_{c1}$ applies:

$$\theta_{c1} = \tan^{-1} h/w_1$$

Ions incident on the wafer at an angle $\theta$ less than $\theta_{c1}$ will not strike against the surface of the passivation layer 32 at the selectively modified MOS devices, but will instead be blocked by the walls of the photoresist layer at those openings, such that this portion of the passivation layer will not be removed by these ions. At the bonding pad locations, the critical angle $\theta_{c2}$ for ion milling is:

$$\theta_{c2} = \tan^{-1} h/w_2$$

where, $w_2$ is the width of the opening 38 at the bonding pad locations and h is the height of the photoresist walls at the opening 38.

However, since $w_2$ is considerably larger, by a factor in the order of five times or more, than $w_1$, and the height h of the photoresist wall is essentially the same at both openings 36 and 38, the critical angle $\theta_{c2}$ for the bonding pad locations is substantially less than $\theta_{c1}$, the critical angle for the modified MOS. Consequently, in order that the milling ions be incident on, and be effective to remove, a major portion of the surface of the passivation nitride layer overlying the bonding pad locations, but not at the location of the selectively modified MOS devices, the incident angle $\theta$ of the milling ions must be:

$$\theta_{c1} > \theta > \theta_{c2}$$

By performing an ion milling technique at an angle of incidence $\theta$ that satisfies the above relationship, a major portion of the nitride 32 overlying the bonding pad 30 is removed without the need for an additional photolithographic operation, but, as desired, the portion of the passivation layer overlying the selectively modified MOS device is unaffected, that is, not removed, as shown in FIG. 1(h).

Thereafter, as shown in FIG. 1(i), the remaining photoresist layer 34 is chemically removed, and the wafer is alloyed.

It will thus be appreciated that the process of the invention, as disclosed with regard to one embodiment thereof, provides selective modification of the electrical characteristics (e.g. threshold voltage) of an MOS device at or near the last stage of device fabrication, without affecting the integrity of the passivation layer structure at the selectively modified MOS devices.

It will also be appreciated that the range of incident angles of the ions utilized in the ion milling technique is a function of the size of the openings above the modified MOS devices, through which the ions (here boron) are implanted perpendicularly, as compared to the size of the openings at the bonding pad. Recent advances in MOS technology have resulted in increased device density and smaller MOS device dimensions, whereas bonding pad sizes have remained essentially unchanged. Should this trend continue, that is, should the ratio of the size of the implant openings to the bonding pad sizes continue to decrease, the range of angles for the obliquely incident milling ions that may be employed to carry out the process of the invention will increase, thereby increasing the flexibility of design techniques available to the fabricator of MOS devices and circuits.

Although the process of the invention has been specifically herein described as employed in fabricating an n-channel device, it may be employed to equal advantage in the fabrication of p-channel devices. The process may also be used to fabricate circuits other than read-only memories, as herein described. Moreover, although in the embodiment of the invention herein described, the ion implantation is carried out before the oblique angle ion milling procedure, the order of these steps could be reversed, in that the oblique angle ion milling could be performed prior to the ion implantation.

It will thus be understood that modifications to the process of the invention as hereinabove described may be made without necessarily departing from the spirit and scope of the invention.

What is claimed is:

1. A process for fabricating an MOS semiconductor circuit which comprises the steps of providing a substrate of a first conductivity type; forming spaced regions of an opposite conductivity type in a surface of said substrate, channel regions being defined between adjacent pairs of said regions which define the source and drain regions of a plurality of field-effect transistors; forming a gate structure at said channel regions; forming a bonding pad on an insulating material overlying a portion of said substrate spaced from said field-effect transistors; said pad being electrically connected to at least one electrical element in said circuit forming a passivation layer over said field-effect transistors and over said bonding pad, thereby forming a completed semiconductor structure with said passivation layer constituting a protective layer therefor, the transistors at this stage in the process having a first electrical characteristic; forming a photoresist layer over said passivation layer; selectively forming at least one relatively narrow opening and at least one relatively wide opening in said photoresist layer at the location of the channel region of at least a selected one of said transistors and at the location of said bonding pad respectively; employing said remaining photoresist layer as an implantation barrier, implanting ions of a sufficient energy through said narrow opening in said photoresist layer and through the exposed portion of said passivation layer and the underlying gate structure of said selected one of said transistors and into the underlying channel region, thereby to form an implantation region therein, said ions being blocked by said bonding pad from penetrating to the area thereunder, said thus formed implantation region modifying the electrical characteristic at said selected one of said transistors to a second electrical characteristic different from said first electric characteristic; removing said passivation layer from over at least a part of said bonding pad by impinging ions at an angle to strike the layer only over the pad while leaving the portion of said passivation layer exposed by said narrow opening in said photoresist layer; and thereafter removing the remaining portion of said photoresist layer.

2. The process of claim 1, in which said ions are of low energy.

3. The process of claim 2, in which the ratio of the width of said narrow opening to the height of said photoresist layer at said narrow opening is such as to effectively block said low-energy ions from striking said portion of said passivation layer exposed by said narrow opening in said photoresist layer.

4. The process of claim 2, in which the angle of incidence of said low-energy ions is less than $\tan^{-1} h_1/w_1$, where $h_1$ is the height of said photoresist layer at said narrow opening after said low-energy ions have been caused to be angularly incident onto said photoresist layer, and $w_1$ is the width of said narrow opening.

5. The process of claim 4, in which the angle of incidence of said low-energy ions is greater than $\tan^{-1} h_2/w_2$, where $h_2$ is the height of said photoresist layer at said wide opening after said low-energy ions have been caused to be angularly incident onto said photoresist layer, and $w_2$ is the width of said wide opening.

6. The process of claim 1, in which said ion-implanting step includes the step of perpendicularly directing said high-energy ions through said narrow opening prior to the removal of said passivation layer from said bonding pad.

7. The process of claim 1, in which said ion-implanting step includes the steps of perpendicularly directing said high-energy ions through said narrow opening subsequent to the removal of said passivation layer from over said bonding pad.

8. A process for fabricating an MOS semiconductor circuit which comprises the steps of providing a substrate; forming a plurality of MOS devices in said substrate; forming a bonding pad on an insulating material overlying a portion of said substrate spaced from said MOS devices; said pad being electrically connected to at least one electrical element in said circuit; forming a passivation layer over said MOS devices and over said bonding pad, thereby forming a completed semiconductor structure with said passivation layer constituting a protective layer therefor; forming a photoresist layer over said passivation layer; selectively forming at least one relatively narrow opening and at least one relatively wide opening in said photoresist layer at the location of at least a selected one of said MOS devices and at the location of said bonding pad respectively; employing said remaining photoresist layer as an implantation barrier, implanting ions of a sufficient energy through said narrow opening in said photoresist layer and through the exposed portion of said passivation layer of said selected one of said MOS devices, thereby to form an implantation region thereunder which modifies the electrical characteristic at said selected one of said MOS devices, said ions being blocked by said bonding pad from penetrating to the area thereunder; employing the portion of said remaining photoresist layer surrounding said narrow opening as a shield against low-energy obliquely incident ions; removing said passivation layer from over said bonding pad by obliquely impinging said low energy ions through said wide opening and onto a major portion of said passivation layer overlying said bonding pad while not removing any significant portion of said passivation layer exposed by said narrow opening; and thereafter removing the remaining portion of said photoresist layer.

9. The process of claim 8, in which the ratio of the width of said narrow opening to the height of said photoresist layer at said narrow opening is such as to effectively block said low-energy obliquely incident ions from striking said portion of said passivation layer exposed by said narrow opening in said photoresist layer.

10. The process of claim 8, in which the angle of incidence of said low-energy ions is less than $\tan^{-1} h_1/w_1$, where $h_1$ is the height of said photoresist layer at said narrow opening after said low-energy ions have been caused to be angularly incident onto said photoresist layer, and $w_1$ is the width of said narrow opening.

11. The process of claim 10, in which the angle of incidence of said low-energy ions is greater than $\tan^{-1} h_2/w_2$, where $h_2$ is the height of said photoresist layer at said wide opening after said low-energy ions have been caused to be angularly incident onto said photoresist layer, and $w_2$ is the width of said wide opening.

12. The process of claim 8, in which said ion-implanting step includes the step of perpendicularly directing said high-energy ions through said narrow opening prior to the removal of said passivation layer from said bonding pad.

13. The process of claim 8, in which said ion-implanting step includes the step of perpendicularly directing said high-energy ions through said narrow opening subsequent to the removal of said passivation layer from over said bonding pad.

* * * * *

UNITED STATES PATENT AND TRADEMARK OFFICE
CERTIFICATE OF CORRECTION

PATENT NO. : 4,208,780
DATED : June 24, 1980
INVENTOR(S) : Paul Richman

It is certified that error appears in the above-identified patent and that said Letters Patent are hereby corrected as shown below:

IN THE CAPTION

Change Assignee from "RCA Corporation, New York, New York"

to -- Standard Microsystems Corporation, Hauppauge, New York--

Signed and Sealed this

Twenty-first Day of October 1980

[SEAL]

Attest:

SIDNEY A. DIAMOND

Attesting Officer     Commissioner of Patents and Trademarks